United States Patent
Kim et al.

(10) Patent No.: US 7,719,453 B2
(45) Date of Patent: May 18, 2010

(54) ANALOGUE-DIGITAL CONVERTER USING JOSEPHSON DAC AND METHOD THEREOF

(75) Inventors: Kyu Tae Kim, Yuseong-gu (KR); Mun Seog Kim, Yuseong-gu (KR); Yon Uk Chong, Seoul (KR)

(73) Assignee: Korea Research Institute of Standards and Science, Daejeon (KR)

( * ) Notice: Subject to any disclaimer, the term of this patent is extended or adjusted under 35 U.S.C. 154(b) by 12 days.

(21) Appl. No.: 12/298,963

(22) PCT Filed: Jul. 31, 2006

(86) PCT No.: PCT/KR2006/003000

§ 371 (c)(1),
(2), (4) Date: Oct. 29, 2008

(87) PCT Pub. No.: WO2007/129786

PCT Pub. Date: Nov. 15, 2007

(65) Prior Publication Data

US 2009/0073017 A1    Mar. 19, 2009

(30) Foreign Application Priority Data

May 10, 2006    (KR)    .................. 10-2006-0041845

(51) Int. Cl.
*H03M 1/00*    (2006.01)
(52) U.S. Cl. ........................ 341/133; 341/144
(58) Field of Classification Search ................ 341/133, 341/144, 134, 171
See application file for complete search history.

(56) References Cited

U.S. PATENT DOCUMENTS 4,686,511 A    8/1987    Koen 5,034,905 A    7/1991    Widdau et al.

(Continued)

FOREIGN PATENT DOCUMENTS

JP    56164628    12/1981

OTHER PUBLICATIONS

International Search Report of corresponding PCT application (PCT/KR2006/003000) dated Feb. 12, 2007.

*Primary Examiner*—Jean B Jeanglaude
(74) *Attorney, Agent, or Firm*—Thomas R. FitzGerald, Esq.; Hiscock & Barclay, LLP

(57) ABSTRACT

The present invention relates to an analog-to-digital converter (ADC) and an analog-to-digital conversion method employing a Josephson digital-to-analog converter (DAC) into an extremely accurate ADC of a physical metrology grade. The ADC includes: a front end ADC for converting an analog input signal into digital data; the Josephson DAC for receiving the digital data from the front end ADC and converting the received digital data into reference analog voltage; a differential ADC for extracting a difference voltage between a reference analog voltage of the Josephson DAC and an unknown input signal; and a data processor for summing output data of the differential ADC and output data of the front end ADC and outputting the summed result. The present invention enables to realize a highly stable Josephson ADC with little time and low cost, which is more accurate in a long-term as compared to any existing semiconductor measurement unit and has a performance that is rarely changed during a lifespan, by combining a programmable array and an existing semiconductor ADC.

8 Claims, 2 Drawing Sheets

U.S. PATENT DOCUMENTS

| | | |
|---|---|---|
| 5,389,929 A | 2/1995 | Mayebi et al. |
| 5,442,575 A | 8/1995 | Gast et al. |
| 5,489,904 A | 2/1996 | Hadidi |
| 5,798,722 A * | 8/1998 | Przybysz et al. ............ 341/133 |
| 6,236,344 B1 * | 5/2001 | Benz et al. .................. 341/133 |

* cited by examiner

ANALOGUE-DIGITAL CONVERTER USING JOSEPHSON DAC AND METHOD THEREOF

TECHNICAL FIELD

The present invention relates to an accurate analog-to-digital converter (hereinafter, referred to as "ADC") with an accuracy level of a physical metrology grade utilizing a Josephson junction array.

BACKGROUND ART

In recently years, industry systems and controllers have gradually been digitalized as cheap CPUs having a high performance become abundantly available. However, most of the controllers share not only a digital part and but also an analog part.

Therefore, in order to transfer signals between different transducers and circuits, an ADC and a digital-to-analog converter (hereinafter, referred to as "DAC") are required.

With the development of a microcomputer, lots of portions that were processed by analog components in the past are now digitally processed after the analog signals are converted into the digital signals using the ADC. This increases the reliability and efficiency of applications.

A Successive Approximation (hereinafter, referred to as "SAR") ADC is one of the ADCs that have been widely used. The SAR ADC is more complicated than a digital ramp ADC in the circuit structure, but has a shorter conversion time.

The basic concept of the conventional ADC will be described below with reference to the accompanying drawing for a SAR ADC.

FIG. 1 is a block diagram showing one possible example of the conventional SAR ADC.

As is shown in FIG. 1, the conventional SAR ADC includes a SAR register 1 that initially specifies a n-bit intermediate value M, a DAC 2 that converts a digital signal, which is specified by the SAR register 1, into an analog signal, and a comparator 3 that compares an analog output value Vref output from the DAC 2 and an analog signal value Vin input for digital conversion and feedbacks the comparison result to the SAR register 1.

One possible operation algorithm of the conventional SAR ADC will be described below assuming.

It is assumed that the resolving power of the ADC is 8 bits and the unknown analog input signal is always positive in polarity. After 10000000 (i.e., the intermediate value M of 8 bits) is initially specified in the SAR register, the value is put into the DAC 2 for analog conversion, thus obtaining the output signal value Vref.

The comparator 3 compares the output signal Vref and the unknown analog signal Vin. If it is determined that the output signal value Vref of the DAC 2 equals to the analog signal value Vin, the conversion operation is completed.

If it is determined that the unknown analog signal Vin is greater than the Vref of the DAC 2, the SAR register 1 again specify the M as 11000000 (i.e., the intermediate value between the previous M and the maximum possible value 1111111) and input the new M to the DAC 2 for analog conversion, and allowing the comparator 3 to again compare the new M value and the unknown analog signal Vin.

To the contrary, if it is determined that the analog signal value Vin input for digital conversion is smaller than the output signal value Vref of the DAC 2, the SAR register 1 again specify the M as 01000000 (i.e., the intermediate value between the previous M and the minimum possible value 00000000) and input them to the DAC 2 for analog conversion, and allowing the comparator 3 to again compare the new M value and the analog signal Vin.

The processes allowing the SAR register specify new intermediate value M into the DAC are repeated until the updated M becomes equal to the unknown analog signal Vin within its resolution power of n-bit.

Another example of the conventional ADC is a flash ADC, the flash ADC converts the unknown analog signals into digital signal at once using comparators as many as the quantization numbers. In the case of an 8-bit ADC, the ADC includes 255 comparators connected to 256 steps voltage divider giving 1/0 signals for each and decodes the 1/0 signals into a binary number. The flash ADC has the highest conversion speed and a frequency range of several GHz.

Furthermore, a double slope ADC are used in an ADC for accurate measurement, and a sigma-delta ADC is used in a high resolution applications.

Furthermore, a RSFQ (Rapid Single Flux Quantum) ADC of a high sensitivity and high resolving power employing a superconducting Josephson junction circuit has been proposed.

The above mentioned ADCs except for the RSFQ ADC are semi-conducting device, requiring a stable voltage reference, such as a Zener diode, as an internal reference unit. The performance of the ADC greatly depends on the accuracy and stability of the internal reference unit.

However, the internal reference units have limited accuracy due to noise and have their characteristics varied depending on external environments, such as temperature and pressure, and used time. Accordingly, if such variation in the characteristics of the internal reference units is not corrected through periodical calibration, original accuracy cannot be obtained.

In a RSFQ ADC, non-conventional ADC where the characteristics of the Josephson junction is employed, an external clock frequency serves as the reference. Accordingly, the RSFQ ADC does not require any internal reference and does not have the problems of the above-mentioned semiconductor ADC.

However, the RSFQ ADC requires a hundred thousand or a million of Josephson junctions for physical metrology applications. This makes the design and fabrication very difficult. The RSFQ ADC is too sensitive to directly connect the signal under measurement, putting a barrier for accurate measurement since its input impedance is so low. Therefore, so far the RSFQ ADC is not suitable for accurate measurement in practice and is being developed for special purposes such as wireless communication or software radar.

DISCLOSURE OF THE INVENTION

Technical Problem

An object of the present invention is to execute a high-stability Josephson DAC simply with little time and low cost, wherein the Josephson DAC has a performance that is rarely changed during its lifetime by combining a programmable array and an conventional existing ADC such as a semiconductor flash ADC and is much more accurate than the conventional existing ADC.

Another object of the present invention is to apply a Josephson DAC to the accurate measurement of a low frequency signal having a utility frequency of 50 Hz or 60 Hz.

Technical Solution

To accomplish the above objects, according to an aspect of the present invention, there is provided a new ADC employing a Josephson DAC which includes: a front end ADC for converting an unknown analog input signal into an approximate digital data; the Josephson DAC for receiving the digital data from the front end ADC and converting the received digital data into a high accuracy reference analog signal; a differential ADC for extracting a difference voltage between the reference output voltage of the Josephson DAC and the unknown input signal; and a data processor for summing output data of the differential ADC and output data of the front end ADC and outputting the summed result.

The ADC further includes a trigger controller connected between an output terminal of the front end ADC and the differential ADC, for detecting a trigger point which can be defined for example as the time at which an output of the front end ADC is rapidly changed. The trigger point can be detected using a differentiator and the trigger controller controls the operation of the differential ADC so that the trigger output signal to the differential ADC can be of a consecutive pulse form generated from the detected trigger point.

Furthermore, as the front end ADC can be used a flash ADC for converting analog data into digital data at once to attain high speed.

Furthermore, an analog-to-digital conversion method employing a Josephson DAC according to another aspect of the present invention includes the steps of converting an analog input signal into digital data, converting digital data into analog data using the Josephson DAC, extracting a difference voltage between a reference output voltage of the Josephson DAC and an unknown input signal, and summing output data of a differential ADC and output data of an input terminal ADC and outputting the summed result.

The method further includes the step of receiving an output of the front end ADC, the step detecting a trigger point at which the output of the input terminal ADC is rapidly changed using a differentiator, and the step controlling the operation trigger for the differential ADC so that the output has a consecutive pulse form generated from the detected time point.

Further objects, specific merits and novel characteristics of the invention will become more apparent from the following detailed description and exemplary embodiments taken in conjunction with the accompanying drawings.

ADVANTAGEOUS EFFECTS

The present invention to be described below is advantageous in that it can take the advantages of two elements: an existing semiconductor ADC as a front end and the Josephson DAC as an internal reference.

A measurement device of such can be constructed conveniently because available are many semiconductor ADCs and peripheral techniques of a variety in the functions and the performances. However, it is difficult to accomplish a high degree of accuracy and stability using such semiconductor devices. The present invention can solve the problems limiting the performance of conventional ADCs and helping to overcome the disadvantages of the conventional ADCs in accuracy significantly by adopting the Josephson DAC having an absolute accuracy as the internal reference.

For example, in the case where the Josephson DAC is applied to DC voltage measurement, if an unknown input signal is about 1 V and the front end ADC is 8 bits, the difference voltage between the Josephson DAC and the unknown input signal is within 3.91 mV. If the accuracy of the differential ADC is about 0.01%, measurement with a high accuracy of about 0.4 microvolt is possible with respect to the 1 V.

If more accurate measurement is required, high accuracy suitable for DC measurement can be accomplished easily by extending the bit number of he input terminal ADC, if appropriate, or by using a more accurate differential ADC (for example, a high accuracy digital multimeter, etc.).

An ADC with a high speed can be also realized to measure an AC voltage waveform.

For example, assuming that the conversion time, mainly taken from when the flash ADC converts a signal to when the differential ADC measures the difference voltage, is about 0.1 ms, a low frequency waveform of 100 Hz can be measured accurately with about 100 samplings per cycle.

If a greater number of samplings or faster measurement of a waveform is required, a faster front end ADC and a faster differential ADC can be used to shorten the conversion time.

Therefore, the present invention not only makes a work simple and fast in measuring a DC and a low frequency waveform, but also enables high accuracy and reliability.

DESCRIPTION OF DRAWINGS

Further objects and advantages of the invention can be more fully understood from the following detailed description taken in conjunction with the accompanying drawings in which.

BEST MODE FOR THE INVENTION

Figure 1:
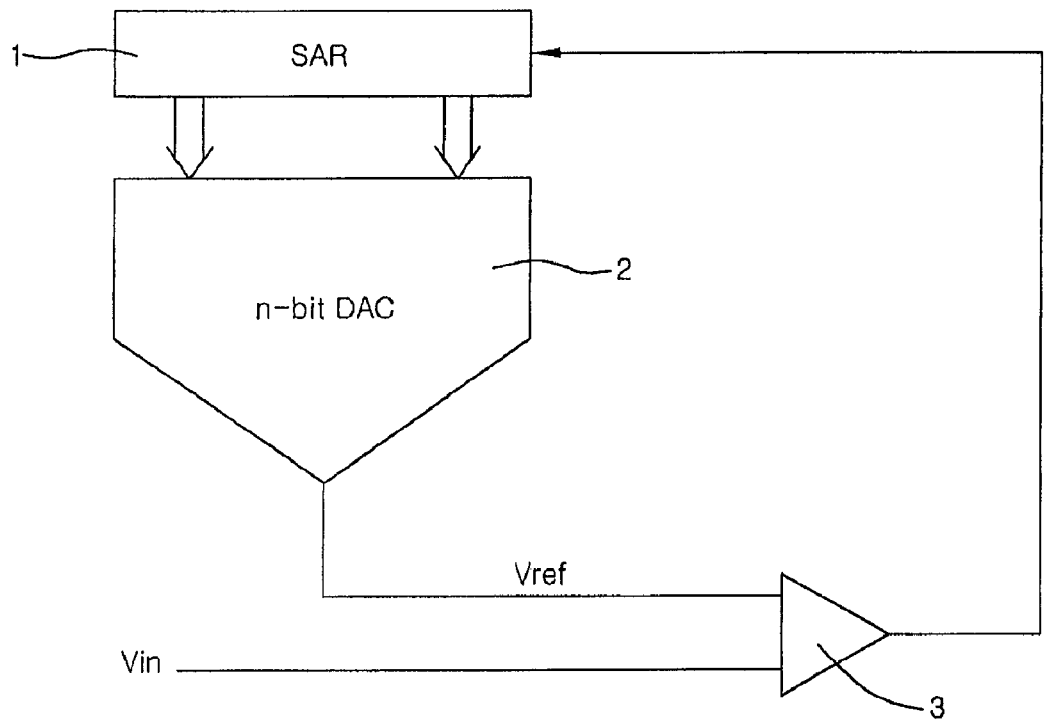
FIG. 1 is a block diagram showing the construction of a conventional ADC.

The present invention will now be described in detail in connection with specific embodiments with reference to the accompanying drawings.

The Josephson junction will be first described below in short.

The Josephson junction has a structure in which for example, a metallic barrier is intervened between two superconductors. A quantum phase difference between the two superconductors can be controlled through an external bias current or an external magnetic field.

If a microwave current of fixed frequency is applied to the Josephson junction, the change rate of the magnetic flux becomes constant equal to a multiplication of flux quantum times the microwave frequency because the phase variation of the Josephson junction is synchronized with the microwave frequency and the magnetic flux in the junction is always quantized as $h/2e$, where h and e are physical constants called as Planck constant and electron charge, respectively.

A constant average voltage appears in proportion to the time change rate of the magnetic flux. Therefore, a voltage value across the Josephson junction generated by the quantum effect (called as, Josephson voltage, hereafter) can be decided accurately based on the frequency and the flux quantum.

Since the frequency can be controlled very accurately, the Josephson standard voltage obtained as described above provides the most accurate voltage standard.

A device of a long Josephson junction array having multi-channel bias lines which can be connected to the every point that divides the Josephson junction array into multiple sub-arrays containing Josephson junctions of a binary number of 2" is called a "programmable Josephson array".

In the programmable Josephson array device, when a bias of each sub-array is turned on or off, a voltage output of each section becomes accurately a multiple of the Josephson voltage and the junction number or 0. The sum voltage of all sub-arrays is provided as the whole output.

Therefore, the programmable Josephson array can be considered as a DA converter (DAC) in which each sub-array corresponds to a binary bit. The programmable Josephson array is applied to a DC and low frequency voltage standard owing to its absolute accuracy of an output voltage.

It may be considered that a device to be accomplished by the present invention belongs to a multi-stage ADC in category.

In the present invention, however, the Josephson DAC made of the programmable Josephson junction array is adopted as the DAC of an ADC circuit, and the difference voltage between the reference output voltage of the Josephson DAC and an unknown input signal is measured using an accurate voltage system or the differential ADC of a high resolving power, thereby completing the operation of the present invention.

That is, an approximate value of the unknown input signal can be firstly measured using the existing semiconductor ADC at the front end in the ADC of this invention.

An accurate reference voltage corresponding to the first measurement value is generated by inputting a binary code of the measurement result to the Josephson DAC. The accurate reference voltage is supplied to a minus terminal of a differential ADC of a next stage, so that the differential ADC can measure only the difference between the unknown input voltage and the reference voltage from the Josephson DAC greatly enhancing the sensitivity and resolution. Furthermore, by utilizing the Josephson reference voltage of high accuracy, accurate measurement is possible based on the Josephson voltage regardless of the accuracy of the front end ADC.

Figure 2:
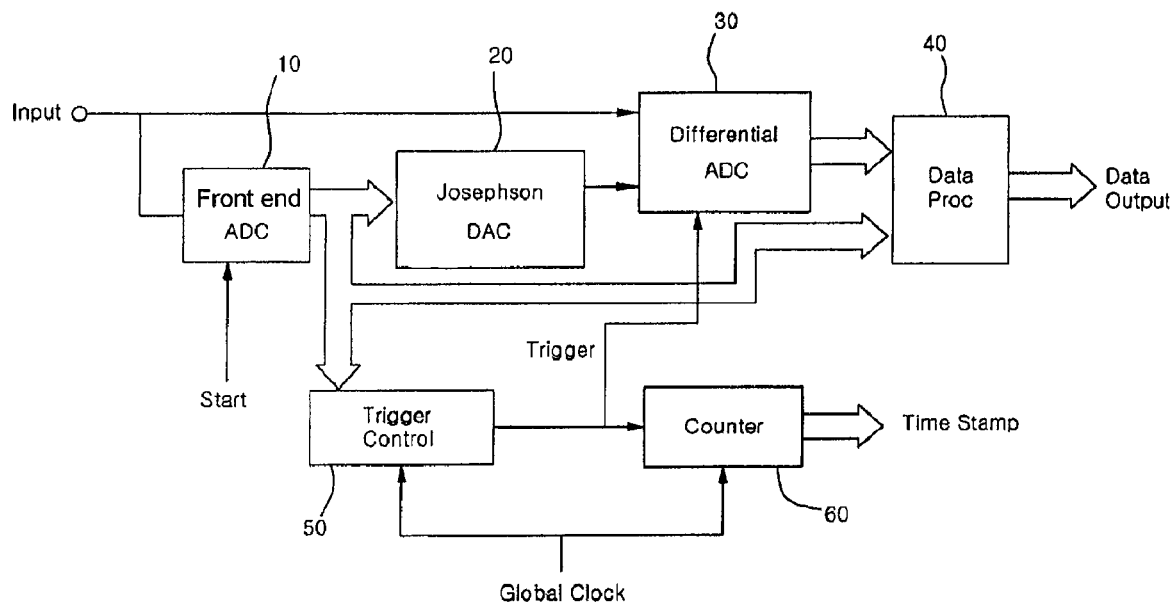
FIG. 2 is a block diagram showing the construction of an ADC according to an embodiment of the present invention.

FIG. 2 is a block diagram showing the construction of an ADC according to an embodiment of the present invention.

In the case where a higher degree of accuracy is required, additional stages of the front end ADCs 10 and Josephson DACs 20 (where n is a given integer) can be added before the differential ADC.

The front end ADC 10, which uses room-temperature elements may be connected through a cryo-probe to the Josephson DAC 20, which is driven under liquid helium. Furthermore, the input terminal ADC 10 may employ a low-temperature ADC operating at a liquid helium temperature.

The easiest method is to use the semiconductor flash ADC of a room temperature as the front end ADC.

The two methods have both advantages and disadvantages and may be applied according to its purpose of use.

In FIG. 2, the input signal variation makes a sudden jump in the input of the Josephson DAC 20 generating a trigger signal detected by a trigger controller 50 that controls the operation of the front end ADC 10 and a differential ADC 30. The trigger signal is controlled to detect the trigger point at which a consecutive pulse form begins to be generated for triggering of the differential ADC after the detected trigger point.

The differential ADC 30 operates to measure the difference voltage at every trigger signal pulses and outputs the measured difference voltage. The measured difference voltage data and the data input to the Josephson DAC are transmitted to a data processor 40 at the same time.

The data processor 40 outputs the summed result taking the weighting factors of the two data, if necessary, into consideration as final measurement data.

Meanwhile, the consecutive trigger signal pulses are sent to a counter 60 at the same time, so that continuous measurement time stamps can be recorded along with the final measurement data through a PC.

In order to control the trigger controller 50 more simply, the differential ADC 20 can be triggered in a free running manner without synchronization with the front end ADC 10. In this case, the method may be insufficient in efficient control of a measurement time, but may be convenient in measuring a signal of a low frequency when measurement time stamp is not important. The methods may be implemented according to its purpose of use by taking the advantages and disadvantages into consideration.

Figure 3:
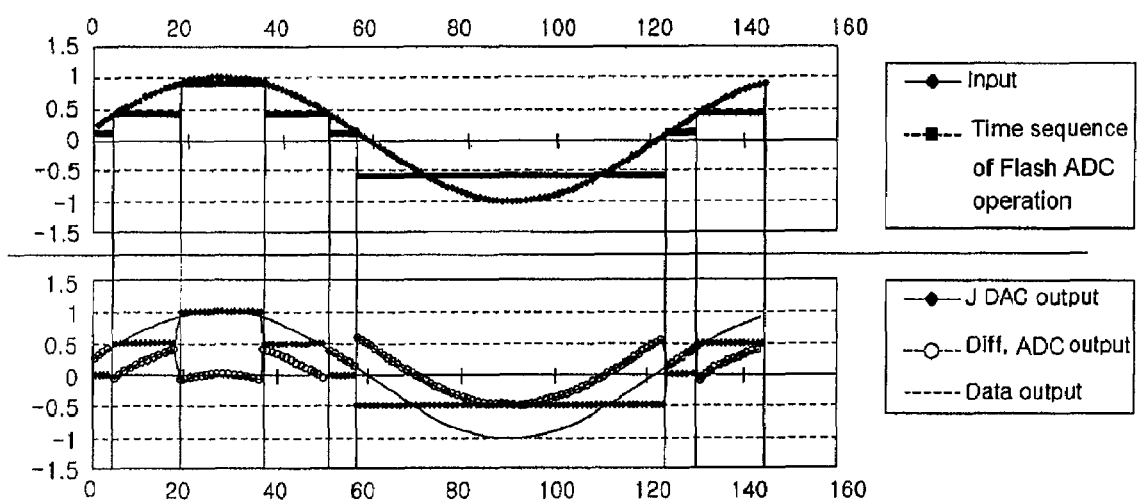
FIG. 3 is a graph illustrating the operation of the ADC shown in FIG. 2 according to an embodiment of the present invention.

FIG. 3 is a graph illustrating the operation of the ADC shown in FIG. 2 according to an embodiment of the present invention.

In the graph of FIG. 3, an X-axis indicates a time and a Y-axis indicates a measurement voltage value. An upper graph in FIG. 3 shows virtual input signals and an exemplary operation of the front end ADC 10 according to the virtual input signals.

Upon actual implementation, the front end ADC 10 may use a very large number of bits, but a 2-bit flash ADC will be described as an example for describing the operating principle.

That is, it is assumed that the front end ADC 10 is designed to output a binary code corresponding of −0.5 when an input voltage is 0 V or less, 0 when the input voltage is 0 V to 0.5 V, 0.5 when the input voltage is 0.5 V to 1 V, and 1 when the input voltage is 1 V or high.

It is again assumed that the front end ADC 10 in reality outputs a code corresponding to −0.5 when the input voltage is 0.1 V or less, 0 when the input voltage ranges from 0.1 V to 0.4 V, 0.5 when the input voltage ranges from 0.4 V to 0.9 V, and 1 when the input voltage is 0.9 V or high, due to the error of, for example, an input divider within the front end ADC 10. In this case, the triggered operation time sequence of the front end ADC can be represented as a step-shaped waveform shown at the upper graph of FIG. 3.

If the four-step output codes; −0.5, 0, 0.5, and 1 are applied to the Josephson DAC 20, the outputs; −0.5 V, 0 V, 0.5 V, and 1 V can be generated accurately corresponding to the inputs (the step-shaped waveform shown at a lower graph of FIG. 3).

The differential ADC 30 measures only the difference voltage of a voltage to be-measured based on the accurate output voltages of the Josephson DAC 20. Therefore, waveforms indicated by circles in the lower graph of FIG. 3 become the outputs of the differential ADC 30. The data processor 40 sums the input code of the Josephson DAC 20 and the output code of the differential ADC 30 to produce final output data.

INDUSTRIAL APPLICABILITY

The present invention is taking the advantages of two elements by using an existing semiconductor ADC as an front end ADC and the Josephson DAC as an internal reference and can also accomplish measurement with higher accuracy and higher stability in a long-term compared to any semiconductor ADCs because the Josephson DAC provides an absolutely high accuracy reference.

Furthermore, an ADC with a high speed can be realized to measure an AC voltage waveform with the technology of this invention. If a greater number of samplings or faster measurement of a waveform is required, a faster ADC can be used to shorten the conversion.

Therefore, the present invention can make a work simple and fast in accurately measuring a DC and a low frequency waveform, and can also obtain accurate and reliable data.

Although the specific embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. An analog-to-digital converter (ADC) employing a Josephson digital-to-analog converter (DAC), the ADC comprising:
   a front end ADC for converting an unknown analog input signal into approximate digital data;
   the Josephson DAC for receiving the digital data from the front end ADC and converting the received digital data into reference analog voltage;
   a differential ADC for extracting a difference voltage between the reference output voltage of the Josephson DAC and an unknown input signal; and
   a data processor for summing output data of the differential ADC and output data of the front end ADC and outputting the summed result.

2. The ADC of claim 1, wherein the front end ADC is a flash or a high resolution ADC for converting analog data into digital data at once or with high resolution.

3. The ADC of claim 1, further comprising a trigger controller connected between an output terminal of the front end ADC and the differential ADC, for detecting a trigger point at which an output of the front end ADC is being rapidly changed or controlling the operation of the differential ADC so that the trigger signal for the differential ADC has a consecutive pulse form generated just after the detected trigger point.

4. The ADC of claim 3, wherein the front end ADC is a flash or a high resolution ADC for converting analog data into digital data at once or with high resolution.

5. An analog-to-digital conversion method employing a Josephson DAC, the method comprising the steps of:
   converting an unknown analog input signal into an approximate digital data;
   converting the approximate digital data into analog reference voltage using the Josephson DAC;
   extracting a difference voltage between the analog reference voltage of the Josephson DAC and the unknown analog input signal; and
   summing output data of a differential ADC and output data of the front end ADC and outputting the summed result in consideration of calibration weighting factor, when necessary.

6. The method of claim 5, wherein the front end ADC is a flash or a high resolution ADC for converting analog data into digital data at once or with high resolution.

7. The method of claim 5, further comprising self-running ADCs without trigger control or the step of receiving an output of the front end ADC, detecting a trigger point at which the output of the front end ADC is being rapidly changed, and controlling the operation of the differential ADC so that the trigger signal of a consecutive pulse form applied to the differential ADC beginning from the detected trigger point.

8. The method of claim 7, wherein the front end ADC is a flash or a high resolution ADC so that the analog input signal can be converted into digital data at once or with high resolution.

* * * * *